(12) United States Patent
Ahn et al.

(10) Patent No.: US 9,190,523 B2
(45) Date of Patent: Nov. 17, 2015

(54) OXIDE SEMICONDUCTOR, THIN FILM TRANSISTOR INCLUDING THE SAME, AND THIN FILM TRANSISTOR ARRAY PANEL INCLUDING THE SAME

(75) Inventors: Byung Du Ahn, Hwaseong-si (KR); Je Hun Lee, Seoul (KR); Sei-Yong Park, Suwon-si (KR); Jun Hyun Park, Suwon-si (KR); Gun Hee Kim, Chungbuk (KR); Ji Hun Lim, Goyang-si (KR); Jae Woo Park, Seongnam-si (KR); Jin Seong Park, Cheonan-si (KR); Toshihiro Kugimiya, Hyogo (JP); Aya Miki, Hyogo (JP); Shinya Morita, Hyogo (JP); Tomoya Kishi, Hyogo (JP); Hiroaki Tao, Hyogo (JP)

(73) Assignees: SAMSUNG DISPLAY CO., LTD. (KR); Jin Seong Park (KR); KOBE STEEL, LTD. (JP)

( * ) Notice: Subject to any disclaimer, the term of this patent is extended or adjusted under 35 U.S.C. 154(b) by 0 days.

(21) Appl. No.: 13/554,393

(22) Filed: Jul. 20, 2012

(65) Prior Publication Data
US 2013/0075720 A1 Mar. 28, 2013

(30) Foreign Application Priority Data
Sep. 22, 2011 (KR) .......................... 10-2011-0095748

(51) Int. Cl.
*H01L 29/786* (2006.01)
*H01L 21/02* (2006.01)
*H01L 29/66* (2006.01)
*H01L 27/12* (2006.01)

(52) U.S. Cl.
CPC ...... *H01L 29/7869* (2013.01); *H01L 21/02565* (2013.01); *H01L 27/1225* (2013.01); *H01L 29/66969* (2013.01)

(58) Field of Classification Search
CPC ............................ H01L 29/7869; H01L 21/16
USPC ....................................... 257/43, 301; 438/591
See application file for complete search history.

(56) References Cited

U.S. PATENT DOCUMENTS

| 5,972,527 | A | 10/1999 | Kaijou et al. |
| 6,727,522 | B1 | 4/2004 | Kawasaki et al. |

(Continued)

FOREIGN PATENT DOCUMENTS

| CN | 101312912 | 11/2008 |
| JP | 05251705 | 9/1993 |

(Continued)

OTHER PUBLICATIONS

Kim, J.-H., et al. Effects of Ti Addition on Sol-Gel Derived InO and InZnO Thin Film Transistors. Current Applied Physics, vol. 12, online publication Jul. 30, 2011, pp. e24-e28.*

(Continued)

*Primary Examiner* — Matthew W Such
*Assistant Examiner* — Warren H Kilpatrick
(74) *Attorney, Agent, or Firm* — Cantor Colburn LLP

(57) ABSTRACT

An oxide semiconductor includes a first material including at least one selected from the group consisting of zinc (Zn) and tin (Sn), and a second material, where a value acquired by subtracting an electronegativity difference value between the second material and oxygen (O) from the electronegativity difference value between the first material and oxygen (O) is less than about 1.3.

9 Claims, 7 Drawing Sheets

(56) References Cited

U.S. PATENT DOCUMENTS

| | | | |
|---|---|---|---|
| 6,878,962 B1 | 4/2005 | Kawasaki et al. | |
| 6,936,188 B1* | 8/2005 | Haga | 252/301.16 |
| 7,061,014 B2 | 6/2006 | Hosono et al. | |
| 7,067,843 B2 | 6/2006 | Carcia et al. | |
| 7,145,174 B2 | 12/2006 | Chiang et al. | |
| 7,189,992 B2 | 3/2007 | Wager et al. | |
| 7,211,825 B2 | 5/2007 | Shih et al | |
| 7,242,039 B2 | 7/2007 | Hoffman et al. | |
| 7,297,977 B2 | 11/2007 | Hoffman et al. | |
| 7,339,187 B2 | 3/2008 | Wager et al. | |
| 7,393,600 B2 | 7/2008 | Inoue et al. | |
| 7,696,513 B2* | 4/2010 | Hayashi et al. | 257/43 |
| 2005/0017244 A1 | 1/2005 | Hoffman et al. | |
| 2006/0108636 A1 | 5/2006 | Sano et al. | |
| 2006/0113536 A1 | 6/2006 | Kumomi et al. | |
| 2006/0113549 A1 | 6/2006 | Den et al. | |
| 2006/0113565 A1 | 6/2006 | Abe et al. | |
| 2007/0023750 A1 | 2/2007 | Chiang et al. | |
| 2007/0052025 A1 | 3/2007 | Yabuta | |
| 2007/0194379 A1 | 8/2007 | Hosono et al. | |
| 2008/0254569 A1 | 10/2008 | Hoffman et al. | |
| 2009/0090914 A1 | 4/2009 | Yano et al. | |
| 2009/0189153 A1 | 7/2009 | Iwasaki et al. | |
| 2009/0267064 A1 | 10/2009 | Yano et al. | |
| 2009/0278122 A1 | 11/2009 | Hosono et al. | |
| 2009/0280600 A1 | 11/2009 | Hosono et al. | |
| 2010/0155721 A1* | 6/2010 | Lee et al. | 257/43 |
| 2011/0081775 A1* | 4/2011 | Pierreux et al. | 438/591 |
| 2011/0114942 A1* | 5/2011 | Akimoto et al. | 257/43 |

FOREIGN PATENT DOCUMENTS

| | | |
|---|---|---|
| JP | 2007142196 | 6/2007 |
| JP | 4164562 | 8/2008 |
| JP | 4170454 | 8/2008 |
| JP | 2009123957 | 6/2009 |
| JP | 2010045263 | 2/2010 |
| KR | 1020080069607 | 7/2008 |
| KR | 1020080074889 | 8/2008 |
| KR | 1020110124530 | 11/2011 |
| KR | 1020110128038 | 11/2011 |
| WO | 03040441 | 5/2003 |
| WO | 2007032294 | 3/2007 |
| WO | 2007058232 | 5/2007 |
| WO | 2009064007 | 5/2009 |

OTHER PUBLICATIONS

Ryu, M.K., et al. High Performance Thin Film Transistor With Cosputtered Amorphous Zn-In-Sn-O Channel: Combinatorial Approach. Applied Physics Letters, vol. 95, online publication Aug. 18, 2009, article 072104.*

Proffit, D.E., et al. X-Ray Absorption Spectroscopy Study of the Local Structures of Crystalline Zn-In-Sn Oxide Thin Films. Journal of Applied Physics, vol. 106, online publication Dec. 10, 2009, article 113524.*

Park et al., Low-Temperature Fabrication and Characteristics of Lanthanum Indium Zinc Oxide Thin Film Transistors, May 2012, IEEE Electron Device Letters, vol. 33, No. 5, pp. 685-687.*

Qijun, Y., et al. Study of Ti Addition in Cannel Layers for In-Zn-O Thin Film Transistors, Applied Surface Science, vol. 258, online publication Oct. 1, 2011, pp. 1460-1463.*

Kim etal. Current Applied Physics, vol. 12, online pubication Jul. 30, 2011, pp. e24-e28.*

Park et al. IEEE Electron Devices Letters, vol. 33, No. 5, May 2012.*

Qijan Applied Surfaces Science, vol. 258,online publication Oct. 1, 2011, pp. 1460-1463.*

* cited by examiner

OXIDE SEMICONDUCTOR, THIN FILM TRANSISTOR INCLUDING THE SAME, AND THIN FILM TRANSISTOR ARRAY PANEL INCLUDING THE SAME

This application claims priority to Korean Patent Application No. 10-2011-0095748 filed on Sep. 22, 2011, and all the benefits accruing therefrom under 35 U.S.C. §119, the content of which in its entirety is herein incorporated by reference.

BACKGROUND OF THE INVENTION (a) Field of the Invention

Exemplary embodiments of the invention relate to an oxide semiconductor, a thin film transistor including the oxide semiconductor, and a thin film transistor array panel including the thin film transistor.

(b) Description of the Related Art

Flat panel displays such as a liquid crystal display ("LCD"), an organic light emitting diode ("OLED") display, an electrophoretic display, a plasma display, for example, typically include multiple pairs of electric field generating electrodes and an electro-optical active layer interposed between the pairs of electric field generating electrodes. The LCD includes a liquid crystal layer as the electro-optical active layer, and the OLED includes an organic light emitting layer as the electro-optical active layer. In flat panel displays, one of a pair of electric field generating electrodes may be connected to a switching element to receive an electric signal, and the electro-optical active layer converts the electric signal into an optical signal to display an image.

The flat panel display may include a display panel having a thin film transistor, e.g., a thin film transistor array panel. The thin film transistor array panel may be patterned with multiple electrodes and semiconductors, and masks may be used in the patterning process.

In the thin film transistor array panel, the semiconductor is an important factor in determining the characteristics of the thin film transistor therein. In the semiconductor including amorphous silicon, the charge mobility therein is low such that there is a limit in manufacturing a high performance thin film transistor. In the semiconductor including polysilicon, the charge mobility therein may be high such that the high performance thin film transistor may be effectively manufactured, while the manufacturing cost may be high and uniformity is low such that there is a limit in manufacturing a large-sized thin film transistor array panel.

Accordingly, a thin film transistor using an oxide semiconductor having high charge mobility and a high ON/OFF ratio of current compared with amorphous silicon and having a low cost and high uniformity compared with polysilicon has been researched.

Research on using zinc oxide (ZnO), tin oxide ($SnO_2$) and zinc-tin oxide (ZnSnO) as the oxide semiconductor has progressed. Furthermore, research on adding a new material to an original material has progressed to improve the characteristics of the oxide semiconductor; however, a conventional method used to determine the added material, which is performed without a theoretical base in the periodic table, may be inefficient since a sample of the thin film transistor is manufactured, and the characteristics thereof are verified for the method.

BRIEF SUMMARY OF THE INVENTION

Exemplary embodiment of the invention includes an oxide semiconductor having improved characteristic and provided using a second material added to a first material, which is an original material of an oxide semiconductor, based on characteristics of the first and second materials, a thin film transistor including the semiconductor including the first and second materials, and a thin film transistor array panel including the thin film transistor including the semiconductor.

An exemplary embodiment of an oxide semiconductor according to the invention includes a first material including at least one selected from the group consisting of zinc (Zn) and tin (Sn), and a second material, where a value acquired by subtracting an electronegativity difference value between the second material and oxygen (O) from the electronegativity difference value between the first material and oxygen (O) is less than about 1.3.

In an exemplary embodiment, a difference between an ionic radius of the first material and an ionic radius of the second material may be less than about 0.35 angstrom.

In an exemplary embodiment, a crystalline structure of the first material may include at least one of a tetragonal structure and an octagonal structure.

In an exemplary embodiment, the second material may include at least one selected from the group consisting of yttrium (Y), niobium (Nb), tantalum (Ta), hafnium (Hf), lanthanum (La), scandium (Sc), vanadium (V), titanium (Ti), magnesium (Mg), aluminum (Al), gallium (Ga) and silicon (Si).

In an exemplary embodiment, the first material may further include at least one selected from the group consisting of indium (In) and gallium (Ga).

In an exemplary embodiment, the first material may be zinc oxide (ZnO), and a value acquired by subtracting the electronegativity difference value between the second material and oxygen from an electronegativity difference value between zinc in the first material and oxygen may be less than about 0.8.

In an exemplary embodiment, a difference between an ionic radius of the first material and an ionic radius of the second material may be less than about 0.35 angstrom.

In an exemplary embodiment, a crystalline structure of the first material may include at least one of a tetragonal structure and an octagonal structure.

In an exemplary embodiment, the first material may be tin oxide (SnO), and a value acquired by subtracting the electronegativity difference value between the second material and oxygen from an electronegativity difference value between tin in the first material and oxygen may be less than about 0.5.

In an exemplary embodiment, a difference between an ionic radius of the first material and an ionic radius of the second material may be less than about 0.8 angstrom.

In an exemplary embodiment, a crystalline structure of the first material may include at least one of a tetragonal structure and an octagonal structure.

An exemplary embodiment of a thin film transistor according to the invention includes: a gate electrode; a source electrode; a drain electrode disposed opposite to the source electrode; an oxide semiconductor disposed between the gate electrode and the source electrode or between the gate electrode and the drain electrode; and a gate insulating layer disposed between the gate electrode and the source electrode or between the gate electrode and the drain electrode, where the oxide semiconductor includes a first material including at least one selected from the group consisting of zinc (Zn) and tin (Sn) and a second material, and a value acquired by subtracting an electronegativity difference value between the second material and oxygen (O) from an electronegativity difference value between the first material and oxygen (O) is less than about 1.3.

In an exemplary embodiment, a difference between an ionic radius of the element forming the first material and an ionic radius of the second material may be less than about 0.35 angstrom.

In an exemplary embodiment, the second material may include at least one selected from the group consisting of yttrium (Y), niobium (Nb), tantalum (Ta), hafnium (Hf), lanthanum (La), scandium (Sc), vanadium (V), titanium (Ti), magnesium (Mg), aluminum (Al), gallium (Ga) and silicon (Si).

In an exemplary embodiment, the first material may further include at least one selected from the group consisting of indium (In) and gallium (Ga).

In an exemplary embodiment, the gate electrode may be disposed under the oxide semiconductor, and the source electrode and the drain electrode may be disposed on the oxide semiconductor.

In an exemplary embodiment, the gate electrode may be disposed on the oxide semiconductor, and the source electrode and the drain electrode may be disposed under the oxide semiconductor.

An alternative exemplary embodiment of a thin film transistor array panel according to the invention includes: a substrate; a gate line disposed on the substrate and including a gate electrode; a gate insulating layer disposed on the gate line; an oxide semiconductor disposed on the gate insulating layer; a data line disposed on the oxide semiconductor and connected to a source electrode; a drain electrode disposed opposite to the source electrode on the oxide semiconductor; and a passivation layer disposed on the data line, where the oxide semiconductor includes a first material including at least one selected from the group consisting of zinc (Zn) and tin (Sn) and a second material, and a value acquired by subtracting an electronegativity difference value between the second material and oxygen (O) from an electronegativity difference value between the first material and oxygen (O) is less than about 1.3.

In an exemplary embodiment, a difference between an ionic radius of the first material and an ionic radius of the second material may be less than about 0.35 angstrom.

In an exemplary embodiment, the second material may include at least one selected from the group consisting of yttrium (Y), niobium (Nb), tantalum (Ta), hafnium (Hf), lanthanum (La), scandium (Sc), vanadium (V), titanium (Ti), magnesium (Mg), aluminum (Al), gallium (Ga) and silicon (Si).

In an exemplary embodiment, the first material may further include at least one selected from the group consisting of indium (In) and gallium (Ga).

In an exemplary embodiment, the source electrode and the drain electrode may contact the oxide semiconductor.

According to exemplary embodiments of the invention, an element, which is determined based on the electronegativity difference and the ionic radius difference, is added to a material of the oxide semiconductor such that the characteristics of the thin film transistor is substantially improved.

BRIEF DESCRIPTION OF THE DRAWINGS

The above and other aspects and features will become more apparent by describing in further detail exemplary embodiments thereof with reference to the accompanying drawings, in which.

DETAILED DESCRIPTION OF THE INVENTION

Figure 1:
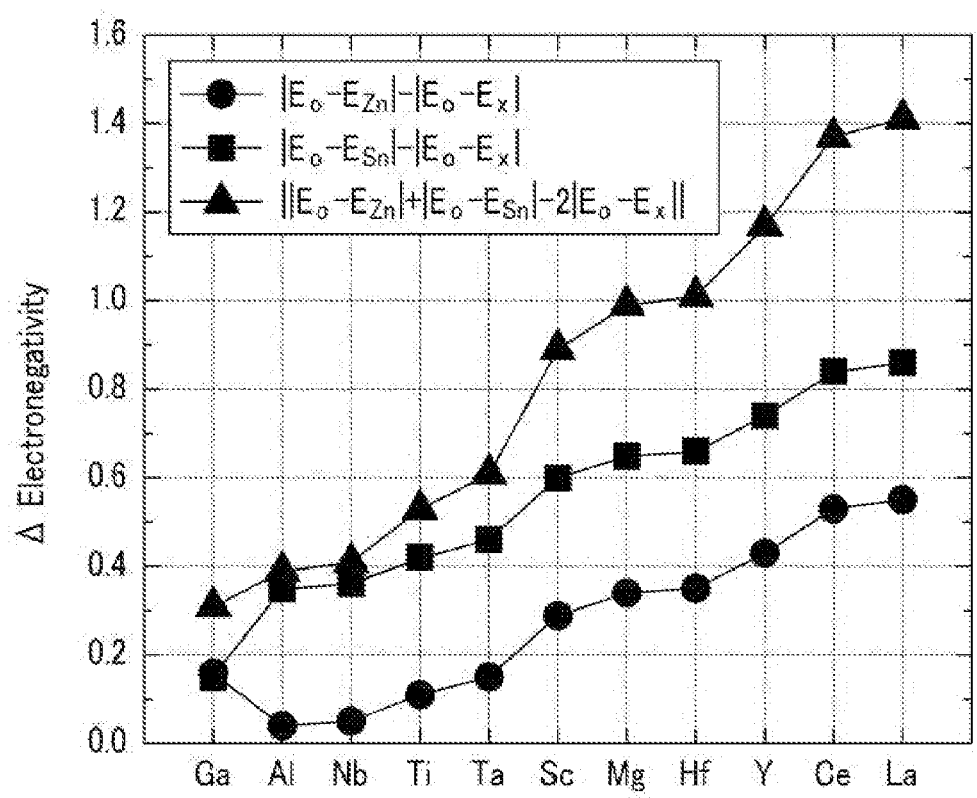
FIG. 1 is a graph showing electronegativity differences of materials included in an exemplary embodiment of an oxide semiconductor according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in detail with reference to the accompanying drawings.

An exemplary embodiment of an oxide semiconductor according to the invention will now be described.

An exemplary embodiment of an oxide semiconductor includes a first material including at least one of zinc (Zn) and tin (Sn). In an exemplary embodiment, the first material may include zinc oxide, tin oxide or zinc-tin oxide.

In such an embodiment, the oxide semiconductor further includes a second material. The second material may be determined based on the conditions described below.

As a first condition, a value acquired by subtracting an electronegativity difference between the element in the second material and oxygen from the electronegativity difference between the element in the first material and oxygen is to be less than a predetermined value. In one exemplary embodiment, for example, when the element in the first material is zinc (Zn) or tin (Sn), and the element of the second material is referred to as element X, the electronegativity difference may be represented by Equation 1 below.

$$E \text{ (electronegativity difference)} = |(|E_O - E_{Zn}| \text{ or } |E_O - E_{Sn}|) - |E_O - E_X||$$ [Equation 1]

Here, $E_X$ denotes the electronegativity of the element X, $E_O$ denotes the electronegativity of oxygen, $E_{Zn}$ denotes the electronegativity of zinc, and $E_{Sn}$ denotes the electronegativity of tin.

As a second condition, the difference between the ionic radius of the element in the first material and the ionic radius of the element in the second material is less than a predetermined value.

In an exemplary embodiment, the second material may include at least one of yttrium (Y), niobium (Nb), tantalum (Ta), hafnium (Hf), lanthanum (La), scandium (Sc), vanadium (V), titanium (Ti), magnesium (Mg), aluminum (Al), gallium (Ga) and silicon (Si).

In an alternative exemplary embodiment, the first material may further include indium or gallium. In an alternative exemplary embodiment, an oxide semiconductor may not include indium or gallium since the cost of indium and gallium is substantially high.

In the first condition, the predetermined value may be changed based on the first material as a mother material. Hereafter, an exemplary embodiment, where the mother material is zinc-tin oxide, will be described.

FIG. 1 is a graph showing electronegativity differences of materials that may be included an exemplary embodiment of an oxide semiconductor according to the invention. Table 1 and Table 2 below show data values represented in the graph of FIG. 1. The electronegativity value of zinc (Zn) is 1.65, the electronegativity value of tin (Sn) is 1.96, and the electronegativity value of oxygen (O) is 3.44.

TABLE 1

| Element X | Electronegativity | $|E_o - E_x|$ | $||E_o - E_{Zn}| - |E_o - E_x||$ |
|---|---|---|---|
| Al | 1.61 | 1.83 | 0.04 |
| Nb | 1.6 | 1.84 | 0.05 |
| Ti | 1.54 | 1.9 | 0.11 |
| Ta | 1.5 | 1.94 | 0.15 |
| Ga | 1.81 | 1.63 | 0.16 |
| Sc | 1.36 | 2.08 | 0.29 |
| Mg | 1.31 | 2.13 | 0.34 |
| Hf | 1.3 | 2.14 | 0.35 |
| Y | 1.22 | 2.22 | 0.43 |
| Ce | 1.12 | 2.32 | 0.53 |
| La | 1.1 | 2.34 | 0.55 |

TABLE 2

| Element X | Electronegativity | $|E_o - E_x|$ | $||E_o - E_{Sn}| - |E_o - E_x||$ |
|---|---|---|---|
| Ga | 1.81 | 1.63 | 0.15 |
| Al | 1.61 | 1.83 | 0.35 |
| Nb | 1.6 | 1.84 | 0.36 |
| Ti | 1.54 | 1.9 | 0.42 |
| Ta | 1.5 | 1.94 | 0.46 |
| Sc | 1.36 | 2.08 | 0.6 |
| Mg | 1.31 | 2.13 | 0.65 |
| Hf | 1.3 | 2.14 | 0.66 |
| Y | 1.22 | 2.22 | 0.74 |
| Ce | 1.12 | 2.32 | 0.84 |
| La | 1.1 | 2.34 | 0.86 |

Referring to FIG. 1, Table 1 and Table 2, the electronegativity difference between the element, such as gallium, aluminum, niobium, titanium and tantalum, for example, and the oxygen is relatively small compared with the electronegativity difference between the oxygen and the mother material of zinc and tin.

Figure 2:
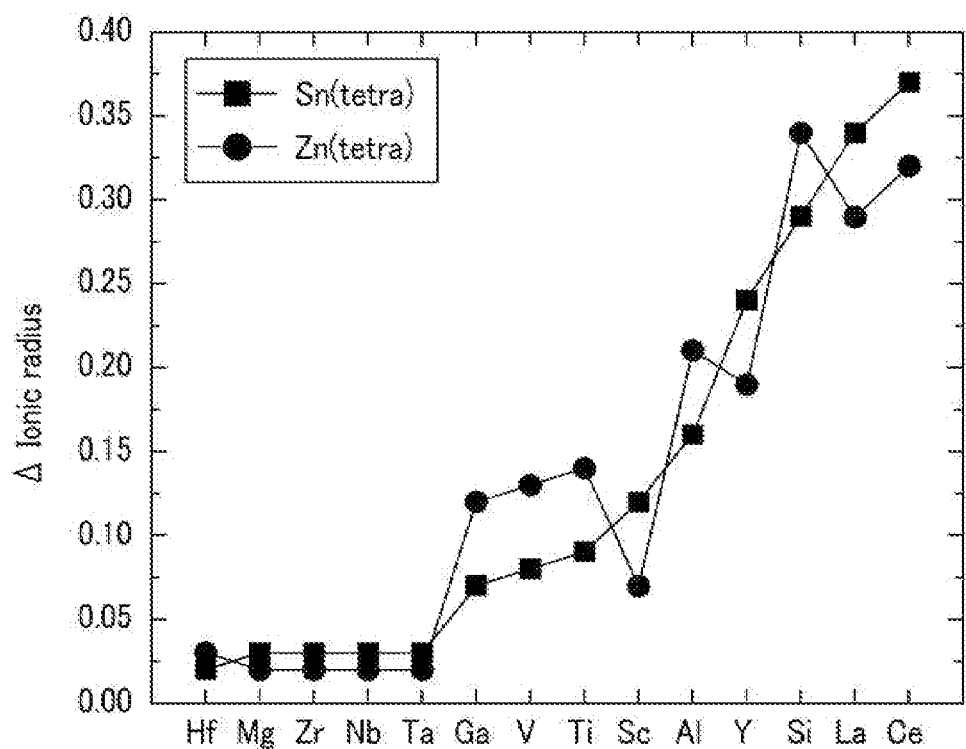
FIGS. 2 to 4 are graphs showing ionic radius difference of materials included in an exemplary embodiment of an oxide semiconductor according to the invention.
Figure 3:
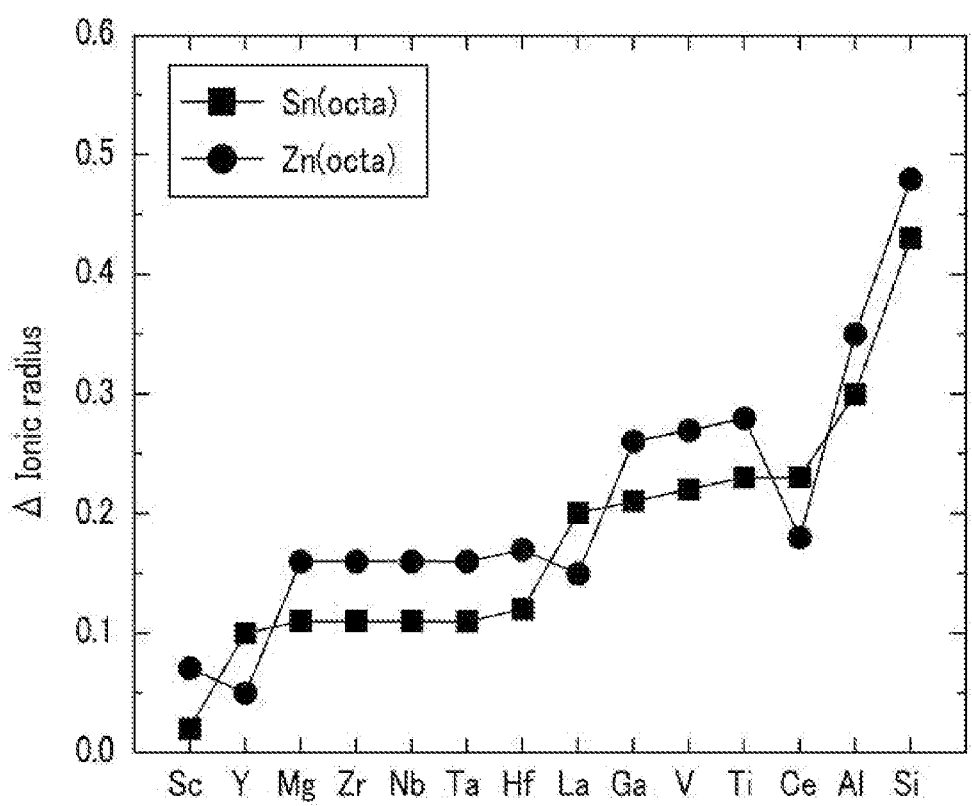
Figure 4:
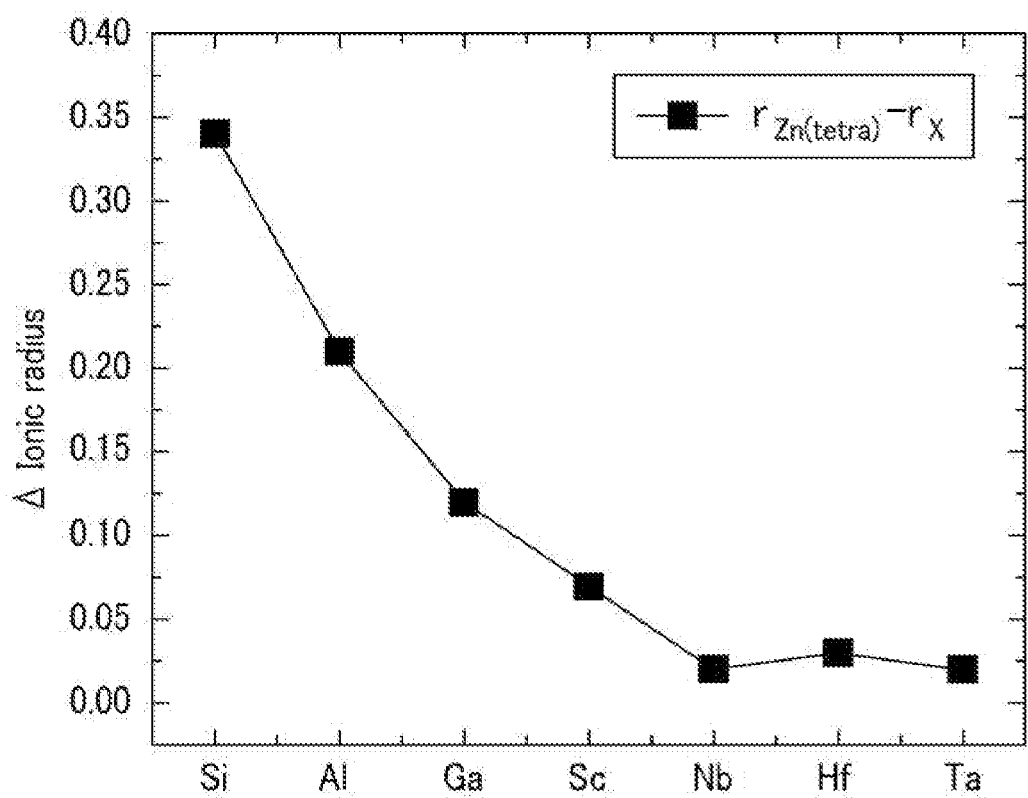

FIGS. 2 to 4 are graphs showing ionic radius differences of first and second materials included in an exemplary embodiment of an oxide semiconductor according to the invention.

FIG. 2 shows ionic radius differences between zinc and tin in the first material and an element in the second material when a crystalline structure of zinc and tin, which are a mother material of an oxide semiconductor, is a tetragonal structure, and FIG. 3 shows ionic radius differences between zinc and tin in the first material and an element in the second material when a crystalline structure of zinc and tin is an octagonal structure.

FIG. 4 shows an ionic radius difference between elements in second materials and the zinc of the tetragonal structure shown in FIG. 2. Table 3 and Table 4 below show data values represented in the graphs of FIGS. 2 to 4.

TABLE 3

| Ion | Ionic radius (Å) | Zn (tetra) 0.74 | Ion | Ionic radius (Å) | Zn (octa) 0.88 |
|---|---|---|---|---|---|
| Mg2+ | 0.72 | 0.02 | Y3+ | 0.93 | 0.05 |
| Zr4+ | 0.72 | 0.02 | Sc3+ | 0.81 | 0.07 |
| Nb3+ | 0.72 | 0.02 | La3+ | 1.03 | 0.15 |
| Ta3+ | 0.72 | 0.02 | Mg2+ | 0.72 | 0.16 |
| Hf4+ | 0.71 | 0.03 | Zr4+ | 0.72 | 0.16 |
| Ta4+ | 0.68 | 0.06 | Nb3+ | 0.72 | 0.16 |
| Sc3+ | 0.81 | 0.07 | Ta3+ | 0.72 | 0.16 |
| Ga3+ | 0.62 | 0.12 | Hf4+ | 0.71 | 0.17 |
| V3+ | 0.61 | 0.13 | Ce3+ | 1.06 | 0.18 |
| Ti4+ | 0.6 | 0.14 | Ta4+ | 0.68 | 0.2 |
| Y3+ | 0.93 | 0.19 | Ga3+ | 0.62 | 0.26 |
| Al3+ | 0.53 | 0.21 | V3+ | 0.61 | 0.27 |
| La3+ | 1.03 | 0.29 | Ti4+ | 0.6 | 0.28 |
| Ce3+ | 1.06 | 0.32 | Al3+ | 0.53 | 0.35 |
| Si4+ | 0.4 | 0.34 | Si4+ | 0.4 | 0.48 |

TABLE 4

| Ion | Ionic radius (Å) | Sn (tetra) 0.69 | Ion | Ionic radius (Å) | Sn (octa) 0.83 |
|---|---|---|---|---|---|
| Ta4+ | 0.68 | 0.01 | Sc3+ | 0.81 | 0.02 |
| Hf4+ | 0.71 | 0.02 | Y3+ | 0.93 | 0.1 |
| Mg2+ | 0.72 | 0.03 | Mg2+ | 0.72 | 0.11 |
| Zr4+ | 0.72 | 0.03 | Zr4+ | 0.72 | 0.11 |
| Nb3+ | 0.72 | 0.03 | Nb3+ | 0.72 | 0.11 |
| Ta3+ | 0.72 | 0.03 | Ta3+ | 0.72 | 0.11 |
| Ga3+ | 0.62 | 0.07 | Hf4+ | 0.71 | 0.12 |
| V3+ | 0.61 | 0.08 | Ta4+ | 0.68 | 0.15 |
| Ti4+ | 0.6 | 0.09 | La3+ | 1.03 | 0.2 |
| Sc3+ | 0.81 | 0.12 | Ga3+ | 0.62 | 0.21 |
| Al3+ | 0.53 | 0.16 | V3+ | 0.61 | 0.22 |
| Y3+ | 0.93 | 0.24 | Ti4+ | 0.6 | 0.23 |
| Si4+ | 0.4 | 0.29 | Ce3+ | 1.06 | 0.23 |
| La3+ | 1.03 | 0.34 | Al3+ | 0.53 | 0.3 |
| Ce3+ | 1.06 | 0.37 | Si4+ | 0.4 | 0.43 |

Referring to FIGS. 2 to 4, Table 3 and Table 4, the ionic radius difference between the mother material such as zinc or tin and the element such as tantalum (Ta), hafnium (Hf), niobium (Nb), scandium (Sc) and gallium (Ga) is relatively small among the elements shown in Table 3 and Table 4.

In an exemplary embodiment of the oxide semiconductor according to the invention, where the mother material is zinc-tin oxide, elements to be include in the second material may be determined such that the electronegativity difference determined using Equation 2 below is less than about 1.3.

$$E \text{ (electronegativity difference)} = |(|E_O - E_{Zn}| + |E_O - E_{Sn}|) - 2|E_O - E_X||$$ [Equation 2]

In an exemplary embodiment, a sum of the difference between each of ionic radiuses of zinc and tin as the first material and the ionic radius of the second material may be less than 1.6 angstroms.

In an alternative exemplary embodiment, the electronegativity difference value of less than 1.3 and the ionic radius difference value of less than 1.6 angstroms may be changed according to a change of the mother material of the oxide semiconductor. In one exemplary embodiment, for example, where the first material is zinc oxide (ZnO), the value acquired by subtracting the electronegativity difference value between the second material and oxygen from the electronegativity difference value between zinc and oxygen may be less than 0.8. In such an embodiment, the difference between the ionic radius of the first material and the ionic radius of the second material may be less than 0.35 angstrom.

In an exemplary embodiment, where the first material is tin oxide (SnO), the value acquired by subtracting the electronegativity difference value between the second material and oxygen from the electronegativity difference value between tin and oxygen may be less than 0.5. In such an embodiment, the difference between the ionic radius of the first material and the ionic radius of the second material may be less than 0.35 angstrom.

Hereinafter, a characteristic of an exemplary embodiment of a thin film transistor including the oxide semiconductor will be described.

In an exemplary experiment, mobility of a charge according to the electronegativity difference is measured to observe the characteristic of the thin film transistor according to a difference of electronegativity between the mother material forming the oxide semiconductor and the second material added thereto, and the electronegativity of oxygen and a difference of ionic radius therebetween.

Figure 5:
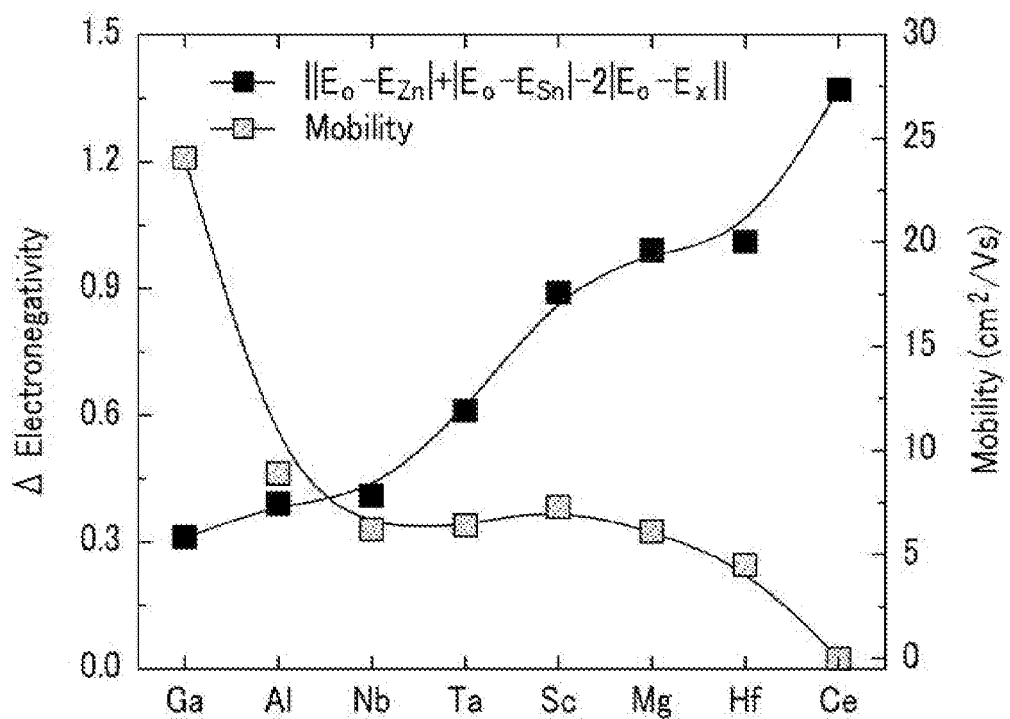
FIG. 5 is a graph showing a relation between charge mobility and electronegativity difference.
Figure 6:
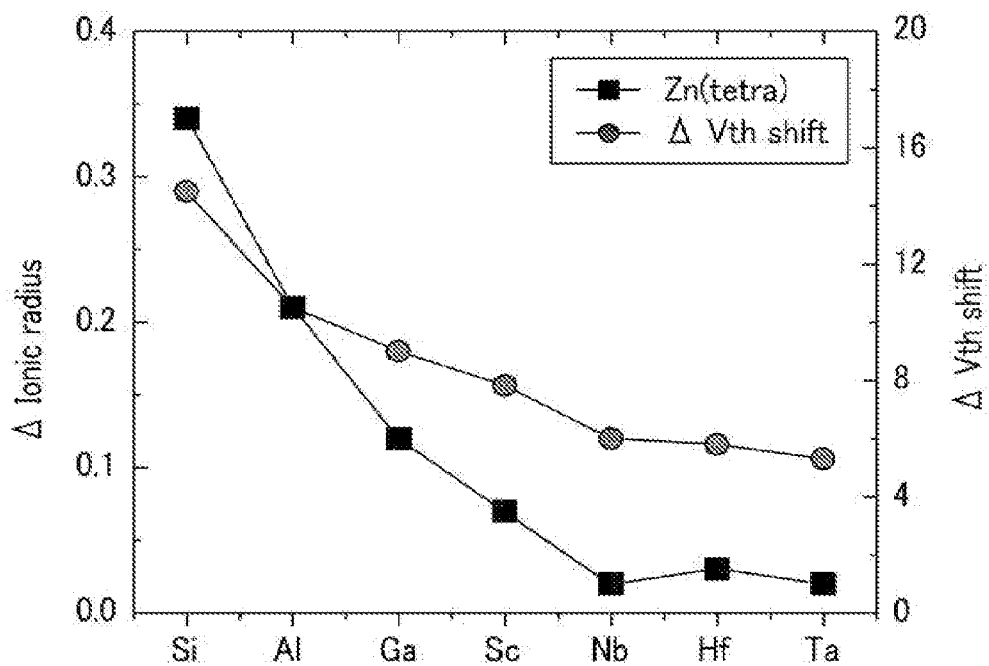
FIG. 6 is a graph showing a relation between threshold voltage and ionic radius difference.

FIG. 5 is a graph showing a relation between electronegativity difference and charge mobility according to the exemplary experiment, and FIG. 6 is a graph showing a relation between threshold voltage and ionic radius difference according to the exemplary experiment.

Referring to FIG. 5, the charge mobility decreases as the electronegativity difference between the mother material forming the oxide semiconductor and the second material added thereto increases.

An electron functioning as a carrier may be generated when an oxygen vacancy is generated because oxygen has escaped from the oxide semiconductor. When the value acquired by subtracting the electronegativity difference between the second material and oxygen from the electronegativity difference between the element of the mother material and oxygen is substantially large, the charge mobility is relatively low. When the value acquired by subtracting the electronegativity difference between the added material and oxygen from the electronegativity difference between the element of the mother material and oxygen is substantially small, the charge mobility is relatively high. In such an embodiment, a generation probability of the oxygen vacancy is decreased as the value of the electronegativity difference between the second material and oxygen subtracted from the electronegativity difference between the element of the mother material and oxygen is relatively large, such that a concentration of electrons generated by the oxygen vacancy being increased is effectively prevented.

Referring to FIG. 6, a change degree of the threshold voltage increases as the difference between an ionic radius of the element of the mother material and an ionic radius of the second material increases. Here, as the change degree of the threshold voltage becomes larger, reliability of the thin film transistor is lowered.

As the difference between the ionic radius of the element of the mother material and the ionic radius of the second mate-rial increases, lattice distortion is generated such that a possibility for an interstitial site to be formed is increased, such that the oxide semiconductor may be damaged.

Accordingly, in an exemplary embodiment of the thin film transistor including the oxide semiconductor, the second material, which may be added to the mother material, is determined based on the electronegativity difference and the ionic radius difference such that trial and error may be reduced and a thin film transistor with improved characteristics may be manufactured.

Hereinafter, an exemplary embodiment of a thin film transistor according to the invention will be described with reference to FIG. 7.

Figure 7:
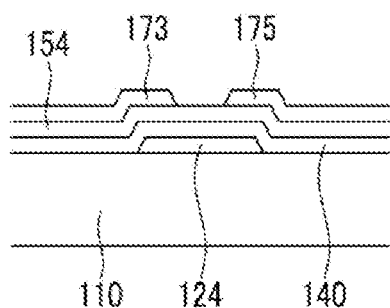
FIG. 7 is a cross-sectional view of an exemplary embodiment of a thin film transistor according to the invention.

FIG. 7 is a cross-sectional view of an exemplary embodiment of a thin film transistor according to the invention.

Referring to FIG. 7, the thin film transistor includes an insulating substrate 110, and a gate electrode 124 disposed on the insulating substrate 110. In an exemplary embodiment, the insulating substrate 110 may be an insulation substrate and may include plastic or glass, for example.

In an exemplary embodiment, the gate electrode 124 may include an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta) and titanium (Ti), for example. In an exemplary embodiment, the gate electrode 124 may include a transparent conductive material such as indium tin oxide ("ITO"), indium zinc oxide ("IZO"), and aluminum doped ZnO ("AZO"). In an exemplary embodiment, the gate electrode 124 may have a multi-layered structure including at least two conductive films (not shown).

The thin film transistor further includes a gate insulating layer 140 disposed on the gate electrode 124. The gate insulating layer 140 may include silicon nitride (SiNx), silicon oxide (SiOx), silicon oxynitride (SiON), or an organic insulating material. The gate insulating layer 140 may have a multilayered structure including at least two insulating layers (not shown). In an exemplary embodiment, for example, an upper layer of the gate insulating layer 140 may include SiOx and a lower layer may include SiNx, or the upper layer may include SiOx and the lower layer may include SiON. In an exemplary embodiment, the gate insulating layer 140 contacting an oxide semiconductor 154 includes an oxide such that degradation of the channel is effectively prevented.

The thin film transistor further includes the oxide semiconductor 154 disposed on the gate insulating layer 140.

In an exemplary embodiment, the oxide semiconductor 154 includes the first material including at least one of zinc (Zn) and tin (Sn), and the second material. In such an embodiment, the oxide semiconductor 154 may include zinc oxide, tin oxide or zinc-tin oxide. The second material may be determined based on the conditions below.

As a first condition, a value acquired by subtracting an electronegativity difference between the element in the second material and oxygen from the electronegativity difference between the element in the first material and oxygen is to be less than a predetermined value. In one exemplary embodiment, for example, when the element forming the first material is zinc (Zn) or tin (Sn), and the element forming the second material is referred to as element X, the electronegativity difference may be represented by Equation 1 below.

$$E\text{ (electronegativity difference)} = |(|E_O - E_{Zn}| \text{ or } |E_O - E_{Sn}|) - |E_O - E_X||$$ [Equation 1]

Here, $|E_X|$ denotes an absolute value of the electronegativity of the element X.

As a second condition, the difference between the ionic radius of the element in the first material and the ionic radius of the element in the second material is to be less than a predetermined value.

In an exemplary embodiment, the second material may include at least one of yttrium (Y), niobium (Nb), tantalum (Ta), hafnium (Hf), lanthanum (La), scandium (Sc), vanadium (V), titanium (Ti), magnesium (Mg), aluminum (Al), gallium (Ga) and silicon (Si).

In an exemplary embodiment the first material may further include indium or gallium. In an alternative exemplary embodiment, indium or gallium may be omitted since the cost of indium and gallium is high.

In the first condition, the predetermined value may be changed according to the first material as a mother material. In an exemplary embodiment, where the mother material is zinc-tin oxide, elements in the second material may be determined such that the electronegativity difference determined using Equation 2 may be about 1.3.

$$E\text{(electronegativity difference)} = |(|E_O - E_{Zn}| + |E_O - E_{Sn}|) - 2|E_O - E_X||$$ [Equation 2]

Also, a sum of the difference of each ionic radius of zinc and tin as the element of the first material and the ionic radius of the second material may be less than about 1.6 angstroms.

In an exemplary embodiment, the electronegativity difference value may be less than about 1.3 and the ionic radius difference value may be less than about 1.6 angstroms as described above, but the invention is not limited thereto. In an exemplary embodiment, the predetermined values of first and second conditions may be changed according to a change of the mother material of the oxide semiconductor. In one exemplary embodiment, for example, where the first material is zinc oxide (ZnO), the value acquired by subtracting the electronegativity difference value between the second material and oxygen from the electronegativity difference value between zinc and oxygen may be less than about 0.8. In such an embodiment, the difference between the ionic radius of the first material and the ionic radius of the second material may be less than about 0.35 angstrom.

In an exemplary embodiment, where the first material is tin oxide (SnO), the value acquired by subtracting the electronegativity difference value between the second material and oxygen from the electronegativity difference value between tin and oxygen may be less than about 0.5. In such an embodiment, the difference between the ionic radius of the first material and the ionic radius of the second material may be less than about 0.35 angstrom.

Figure 8:
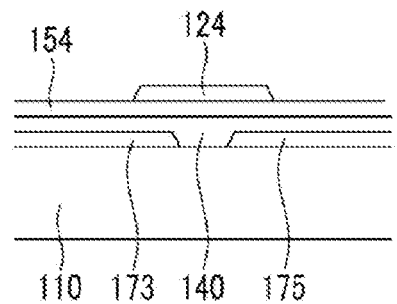
FIG. 8 is a cross-sectional view of an alternative exemplary embodiment of a thin film transistor according to the invention.

FIG. 8 is a cross-sectional view of an alternative exemplary embodiment of a thin film transistor according to the invention.

Differently from the thin film transistor in FIG. 7, in the thin film transistor of FIG. 8, the gate electrode 124 is positioned on the oxide semiconductor 154, and the source electrode 173 and the drain electrode 175 are positioned under the oxide semiconductor 154. The material, the multi-layered structure and the oxide semiconductor of the thin film transistor in FIG. 8 may be substantially the same as those of the thin film transistor of FIG. 7.

Next, an exemplary embodiment of a thin film transistor array panel according to the invention will be described with reference to FIGS. 9 and 10. In an exemplary embodiment, a thin film transistor array panel may be applied to a liquid crystal display, for example, which will now be described. In an alternative exemplary embodiment, however, the thin film transistor array panel may be applied to other types of flat panel display such as an organic light emitting device, for example.

Figure 9:
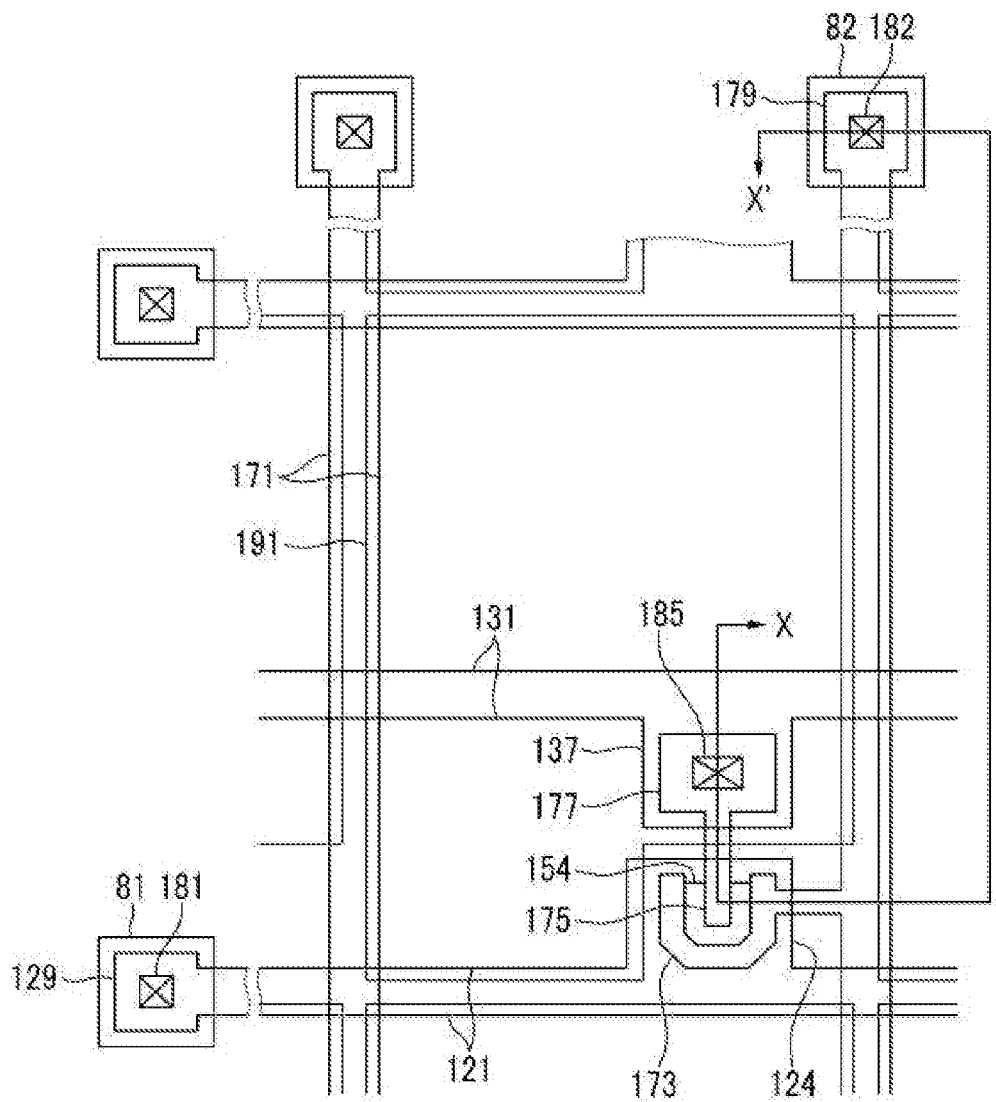
FIG. 9 is a top plan view of an exemplary embodiment of a thin film transistor array panel according to the invention.
Figure 10:
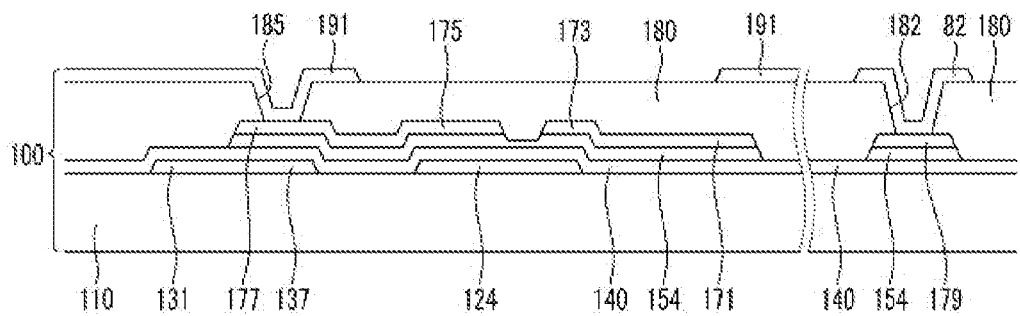
FIG. 10 is a cross-sectional view taken along line X-X' of the thin film transistor array panel in FIG. 9.

FIG. 9 is a top plan view of an exemplary embodiment of a thin film transistor array panel according to the invention. FIG. 10 is a cross-sectional view taken along line X-X' of the thin film transistor array panel 100 of FIG. 9.

The thin film transistor array panel 100 may include an insulating substrate 110 including glass or plastic, for example. The thin film transistor array panel 100 includes a gate line 121 (and 129), a gate electrode 124, a storage electrode line 131 and a storage electrode 137, which are disposed on the insulating substrate 110. In an exemplary embodiment, the gate line 121 transmits a gate signal and extends substantially in a row direction, and includes a plurality of gate electrodes 124 protruding upwardly therefrom and an end portion 129. In an alternative exemplary embodiment, the end portion 129 of the gate line may be omitted.

The storage electrode line 131 is applied with a predetermined voltage and extends substantially parallel to the gate line 121, and includes the storage electrode 137 having substantially a quadrangular shape. In an exemplary embodiment, the shape and arrangement of the storage electrode line 131 and the storage electrode 137 is not limited to specific shape and arrangement, but may be variously changed. In an alternative exemplary embodiment, the storage electrode line 131 and the storage electrode 137 may be omitted.

The gate line 121 (including the end portion 129 thereof) and the storage electrode line 131 may include an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta) and titanium (Ti), for example. In an exemplary embodiment, the gate line 121 (including the end portion 129 thereof) and the storage electrode line 131 may include a transparent conductive material such as ITO, IZO and AZO, for example. In an exemplary embodiment, the gate line 121 (including the end portion 129 thereof) and the storage electrode line 131 may have a multi-layered structure including two conductive films (not shown).

The thin film transistor array panel 100 may include a gate insulating layer 140 disposed on the gate lines 121 and the storage electrode lines 131. The gate insulating layer 140 may include silicon nitride (SiNx), silicon oxide (SiOx), silicon oxynitride (SiON), or an organic insulating material. The gate insulating layer 140 may have a multi-layered structure including at least two insulating layers (not shown). In an exemplary embodiment, for example, the gate insulating layer 140 may include an upper layer and a lower layer. In such an embodiment, the upper layer of the gate insulating layer 140 may include SiOx and the lower layer may include SiNx, or the upper layer may include SiOx and the lower layer may include SiON. In an exemplary embodiment, the gate insulating layer 140 contacting an oxide semiconductor 154 includes an oxide, such that degradation of the channel is effectively prevented.

The thin film transistor array panel 100 may include the oxide semiconductor 154 including the first material including at least one of zinc (Zn) and tin (Sn), and the second material. Here, the oxide semiconductor 154 may include zinc oxide, tin oxide or zinc-tin oxide. The second material may be determined based on the conditions below.

As a first condition, a value acquired by subtracting an electronegativity difference between the element in the second material and oxygen from the electronegativity difference between the element in the first material and oxygen is to be less than a predetermined value. In one exemplary embodiment, for example, when the element forming the first material is zinc (Zn) or tin (Sn), and the element in the second material is referred to as element X, the electronegativity difference may be represented by Equation 1 below.

$$E \text{ (electronegativity difference)} = |(|E_O-E_{Zn}| \text{ or } |E_O-E_{Sn}|) - |E_O-E_X||$$ [Equation 1]

Here, $E_X$ denotes the electronegativity of the element X, $E_O$ denotes the electronegativity of oxygen, $E_{Zn}$ denotes the electronegativity of zinc, and $E_{Sn}$ denotes the electronegativity of tin.

As a second condition, the difference between the ionic radius of the element in the first material and the ionic radius of the element in the second material is to be less than a predetermined value.

In an exemplary embodiment, the second material may include at least one of yttrium (Y), niobium (Nb), tantalum (Ta), hafnium (Hf), lanthanum (La), scandium (Sc), vanadium (V), titanium (Ti), magnesium (Mg), aluminum (Al), gallium (Ga) and silicon (Si).

In an exemplary embodiment, the first material may include indium or gallium. In an alternative exemplary embodiment, indium or gallium may be omitted since the cost of indium and gallium is substantially high In the first condition, the predetermined value may be changed according to the first material as a mother material. When the mother material is zinc-tin oxide, the electronegativity difference determined using Equation 2 may be about 1.3.

$$E \text{ (electronegativity difference)} = |(|E_O-E_{Zn}|+|E_O-E_{Zn}|)-2|E_O-E_X||$$ [Equation 2]

Also, a sum of the difference of each ionic radius of zinc and tin as the element forming the first material and the ionic radius of the second material may be less than about 1.6 angstroms.

In an exemplary embodiment, the electronegativity difference value of less than about 1.3 and the ionic radius difference value of less than about 1.6 angstroms may be changed according to a change of the mother material of the oxide semiconductor. In an exemplary embodiment, where the first material is zinc oxide (ZnO), the value acquired by subtracting the electronegativity difference value between the second material and oxygen from the electronegativity difference value between zinc and oxygen may be less than about 0.8. In such an embodiment, the difference between the ionic radius of the first material and the ionic radius of the second material may be less than about 0.35 angstrom.

In an exemplary embodiment, where the first material is tin oxide (SnO), the value acquired by subtracting the electronegativity difference value between the second material and oxygen from the electronegativity difference value between tin and oxygen may be less than about 0.5. In such an embodiment, the difference between the ionic radius of the first material and the ionic radius of the second material may be less than about 0.35 angstrom.

The thin film transistor array panel 100 may include a data line 171 (including an end portion 179 thereof), a source electrode 173 and a drain electrode 175, which are disposed on the oxide semiconductor 154. In an exemplary embodiment, ohmic contact layers doped with impurities may be disposed between the oxide semiconductor 154 and the data line 171 (including the end portion 179 thereof). In an alternative exemplary embodiment, the ohmic contact layers doped with impurities may not be disposed between the oxide semiconductor 154 and the data line 171 (including the end portion 179 thereof). The data line 171 transmits a data voltage and extends substantially in a column direction, thereby intersecting the gate line 121. The data line 171 includes the end portion 179, and a source electrode 173 curved in a U-like shape on the gate electrode 124, but not being limited thereto. In an exemplary embodiment, the shape of the source electrode 173 may be variously changed.

The drain electrode 175 is separated from the data line 171, and includes a narrow portion and a wide portion 177. The narrow portion includes an end portion enclosed by the source electrode 173, and the wide portion 177 is substantially quadrangular and overlaps the storage electrode 137. The wide portion 177 of the drain electrode 175 may have an area substantially the same as an area of the storage electrode 137.

The data line 171 (including the end portion 179 thereof), the source electrode 173, and the drain electrode 175 (including the wide portion 177 thereof) may include an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta), titanium (Ti), etc. In one exemplary embodiment, for example, the molybdenum alloy may be Mo—Nb or Mo—Ti. In an exemplary embodiment, the data line 171 (including the end portion 179 thereof) and the drain electrode 175 (including the wide portion 177 thereof) may include a transparent conductive material such as ITO, IZO and AZO, for example. In an exemplary embodiment, the data line 171 (including the end portion 179 thereof), the source electrode 173, and the drain electrode 175 (including the wide portion 177 thereof) have a multi-layered structure including at least two conductive films (not shown) having different physical characteristics. In an exemplary embodiment, the multi-layered structure may include conductive films of Mo/Al/Mo, Mo/Al, Mo/Cu, CuMn/Cu and Ti/Cu, for example.

In an exemplary embodiment, the gate electrode 124, the source electrode 173 and the drain electrode 175 collectively defines a thin film transistor along with the oxide semiconductor 154, and the channel of the thin film transistor is disposed in the semiconductor 154 between the source electrode 173 and the drain electrode 175. The drain electrode 175 is connected to a pixel electrode 191, thereby applying the driving voltage.

The oxide semiconductor 154, and the data line 171 (including the end portion 179 thereof) and the drain electrode 175 (including the wide portion 177 thereof) may have substantially the same plane shape. However, the data line 171 (including the end portion 179 thereof), the source electrode 173 and the drain electrode 175 (including the wide portion 177 thereof) are not covering the channel of the thin film transistor. In an exemplary embodiment, the three layers including the oxide semiconductor 154, and the data line 171 (including the end portion 179 thereof) and the drain electrode 177, may be sequentially deposited on a surface and may be patterned using one mask. In an alternative exemplary embodiment, each of the oxide semiconductor 154 and the data line 171 (including the end portion 179 thereof) may be formed using one mask.

The thin film transistor array panel 100 may further include a disposed on the data line 171 (including the end portion 179 thereof) and the drain electrode 175. The passivation layer 180 may include silicon nitride (SiNx), silicon oxide (SiOx) or silicon oxynitride (SiON), for example. The passivation layer 180 may include an organic insulating material. The passivation layer 180 may have multi-layered structure. In one exemplary embodiment, for example, the passivation layer 180 may include an upper layer and a lower layer. In such an embodiment, the upper layer of the passivation layer 180 may include SiOx and the lower layer may include SiNx, or the upper layer may include SiOx and the lower layer may include SiON. In an exemplary embodiment, the passivation layer 180 contacting the oxide semiconductor 154 includes an oxide, such that degradation of the channel is effectively prevented. The passivation layer 180 includes a first contact hole 185 exposing the drain electrode 177, second contact hole 181 exposing the end portion 129 of the gate line 121 and a third contact hole 182 exposing the end portion 179 of the data line. The pixel electrode 191 is connected to the drain electrode 177 through the first contact hole 185. The end portion 129 of the gate line 121 is connected to a connecting member 81 through the second contact hole 181, and the end portion 179 of the data line 171 is connected to a connecting member 82 through the third contact hole 182.

The pixel electrode 191 is disposed on the passivation layer 180. The pixel electrode 191 may include a transparent conductive oxide such as ITO, IZO and AZO, for example. The connecting members 81 and 82 are disposed on the end portions 129 and 179 of the gate line 121 and the data line 171. The connecting members 81 and 82 may include a material substantially the same as the material of the pixel electrode 191.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A thin film transistor comprising:
a gate electrode;
a source electrode;
a drain electrode disposed opposite to the source electrode;
an oxide semiconductor disposed between the gate electrode and the source electrode or between the gate electrode and the drain electrode; and
a gate insulating layer disposed between the gate electrode and the source electrode or between the gate electrode and the drain electrode,
wherein the oxide semiconductor comprises:
a first material comprising at least one selected from the group consisting of zinc (Zn) and tin (Sn); and
a second material comprising at least one selected from the group consisting of yttrium (Y), niobium (Nb), lanthanum (La), scandium (Sc), and vanadium (V), and
wherein a value acquired by subtracting an electronegativity difference value between the second material and oxygen (O) from an electronegativity difference value between the first material and oxygen (O) is less than about 1.3.

2. The thin film transistor of claim 1, wherein
a difference between an ionic radius of the first material and an ionic radius of the second material is less than about 0.35 angstrom.

3. The thin film transistor of claim 1, wherein
the first material further comprises least one selected from the group consisting indium (In) and gallium (Ga).

4. The thin film transistor of claim 1, wherein
the gate electrode is disposed under the oxide semiconductor, and the source electrode and the drain electrode are disposed on the oxide semiconductor.

5. The thin film transistor of claim 1, wherein
the gate electrode is disposed on the oxide semiconductor, and
the source electrode and the drain electrode are disposed under the oxide semiconductor.

6. A thin film transistor array panel comprising:
a substrate;
a gate line disposed on the substrate and including a gate electrode;
a gate insulating layer disposed on the gate line;
an oxide semiconductor disposed on the gate insulating layer;
a data line disposed on the oxide semiconductor and connected to a source electrode;
a drain electrode disposed opposite to the source electrode on the oxide semiconductor; and
a passivation layer disposed on the data line,
wherein the oxide semiconductor comprises:
a first material comprising at least one selected from the group consisting of zinc (Zn) and tin (Sn): and
a second material comprising at least one selected from the group consisting of yttrium (Y), niobium (Nb), lanthanum (La), scandium (Sc), and vanadium (V), and
wherein a value acquired by subtracting an electronegativity difference value between the second material and oxygen (O) from an electronegativity difference value between the first material and oxygen (O) is less than about 1.3.

7. The thin film transistor array panel of claim 6, wherein a difference between an ionic radius of the first material and an ionic radius of the second material is less than about 0.35 angstrom.

8. The thin film transistor array panel of claim 6, wherein the first material further comprises at least one selected from the group consisting of indium (In) gallium (Ga).

9. The thin film transistor array panel of claim 6, wherein the source electrode and the drain electrode contact the oxide semiconductor.

\* \* \* \* \*